US009955617B2

(12) United States Patent
Nozawa

(10) Patent No.: US 9,955,617 B2
(45) Date of Patent: Apr. 24, 2018

(54) ELECTRONIC CIRCUIT COMPONENT MOUNTING METHOD AND MOUNTING SYSTEM

(71) Applicant: FUJI MACHINE MFG. CO., LTD., Chiryu-shi (JP)

(72) Inventor: Mizuho Nozawa, Nukata-gun (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 230 days.

(21) Appl. No.: 14/769,552

(22) PCT Filed: Feb. 25, 2013

(86) PCT No.: PCT/JP2013/054776

§ 371 (c)(1),
(2) Date: Aug. 21, 2015

(87) PCT Pub. No.: WO2014/128968

PCT Pub. Date: Aug. 28, 2014

(65) Prior Publication Data

US 2016/0007513 A1 Jan. 7, 2016

(51) Int. Cl.

*H05K 13/04* (2006.01)
*H05K 3/30* (2006.01)
*H05K 13/08* (2006.01)

(52) U.S. Cl.

CPC ........... *H05K 13/0404* (2013.01); *H05K 3/30* (2013.01); *H05K 13/043* (2013.01); *H05K 13/0417* (2013.01); *H05K 13/0452* (2013.01); *H05K 13/08* (2013.01)

(58) Field of Classification Search

CPC ...... H05K 3/30; H05K 3/301; H05K 13/0015; H05K 13/0084; H05K 13/02;

(Continued)

(56) References Cited

U.S. PATENT DOCUMENTS 5,649,356 A * 7/1997 Gieskes ............... H05K 13/028 29/710
6,195,876 B1 * 3/2001 Koyama ............. H05K 13/028 29/33 J (Continued)

FOREIGN PATENT DOCUMENTS

EP 1 632 119 3/2006
JP 2002 280793 9/2002

(Continued)

OTHER PUBLICATIONS

Machine translation of description section of JP 2002-280793 provided by EPO website (Espacenet.com).*

(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57) ABSTRACT

A mounting method performed by an electronic circuit component mounting machine that includes a tape feeder which is mounting-machine-main-body-side feeder held by a mounting machine main body, and a bulk feeder which is head-side feeder moved to any position on a movement plane covering a circuit-substrate conveying and holding device and the mounting-machine-main-body-side feeder is improved. A reception order is determined, so as to reduce the number of times a mounting head moves between the circuit-substrate conveying and holding device and the mounting-machine-main-body-side feeder and the receiving of first type components supplied from the tape feeder and the receiving of second type components supplied from the bulk feeder are respectively performed together as a batch.

9 Claims, 14 Drawing Sheets

(58) Field of Classification Search
CPC .. H05K 13/021; H05K 13/022; H05K 13/028; H05K 13/029; H05K 13/04; H05K 13/0404; H05K 13/0408; H05K 13/0413; H05K 13/0417; H05K 13/043; H05K 13/0434; H05K 13/0452; H05K 13/0478; H05K 13/08; Y10T 29/53174; Y10T 29/53178; Y10T 29/53191; Y10T 29/53252; Y10T 29/53261; Y10T 29/53313; Y10T 29/53378; Y10T 29/53478; Y10T 29/5303; Y10T 29/53061
USPC ......... 29/739, 740, 743, 757, 759, 771, 786, 29/809, 832
See application file for complete search history.

(56) References Cited

U.S. PATENT DOCUMENTS

2004/0128827 A1 7/2004 Shimizu et al.
2005/0288806 A1 12/2005 Yamazaki et al.
2008/0154392 A1* 6/2008 Maenishi ............... H05K 13/08 700/32
2010/0050426 A1 3/2010 Shimizu et al.
2012/0227255 A1 9/2012 Shimizu et al.
2013/0212876 A1 8/2013 Shimizu et al.

FOREIGN PATENT DOCUMENTS

JP 2008 198778 8/2008
JP 2008 258382 10/2008
WO WO 2004/107838 A1 12/2004

OTHER PUBLICATIONS

International Search Report dated Apr. 16, 2013 in PCT/JP2013/054776 filed Feb. 25, 2013.
Extended European Search Report dated Nov. 15, 2016 in Patent Application No. 13875359.5.

* cited by examiner

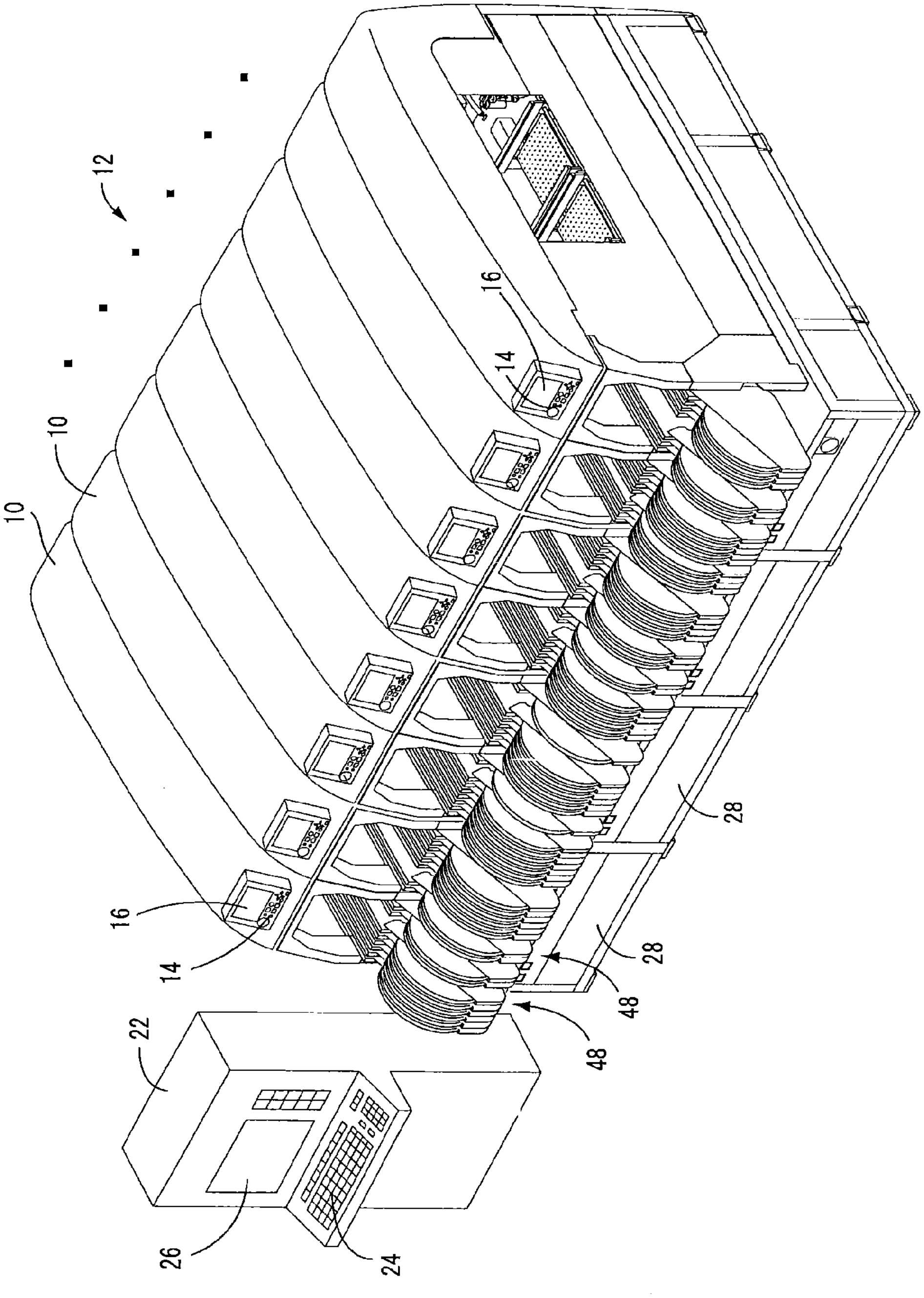
[FIG. 1]

[FIG. 2]
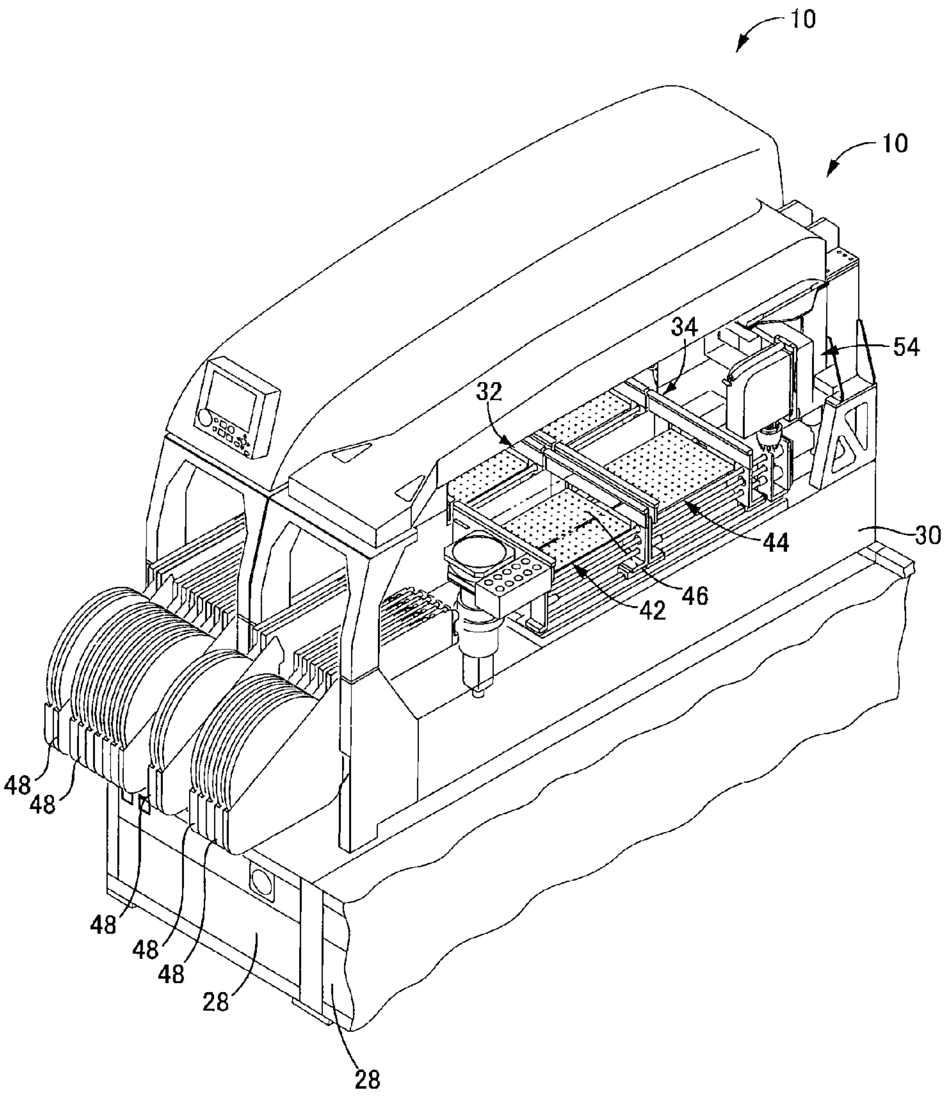

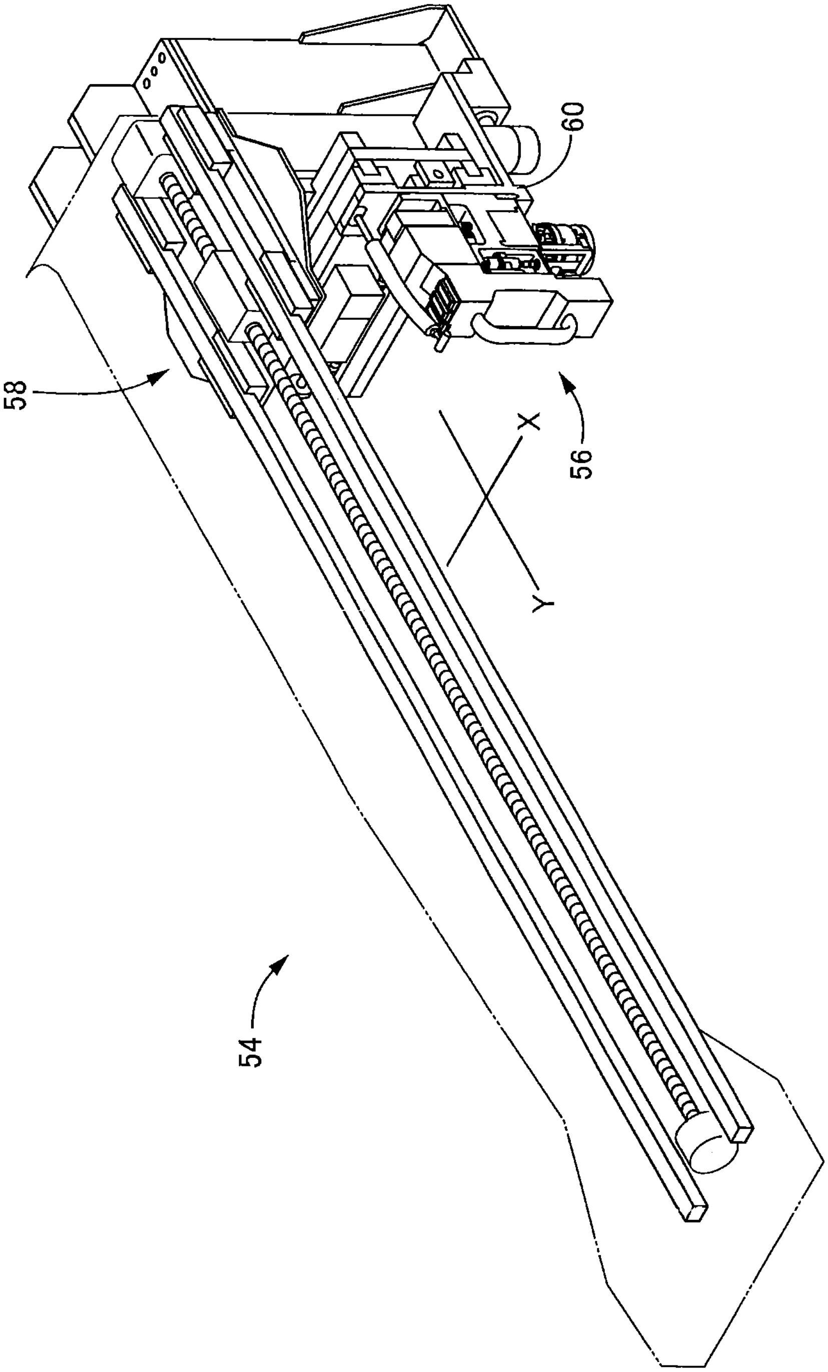
[FIG. 3]

[FIG. 4]
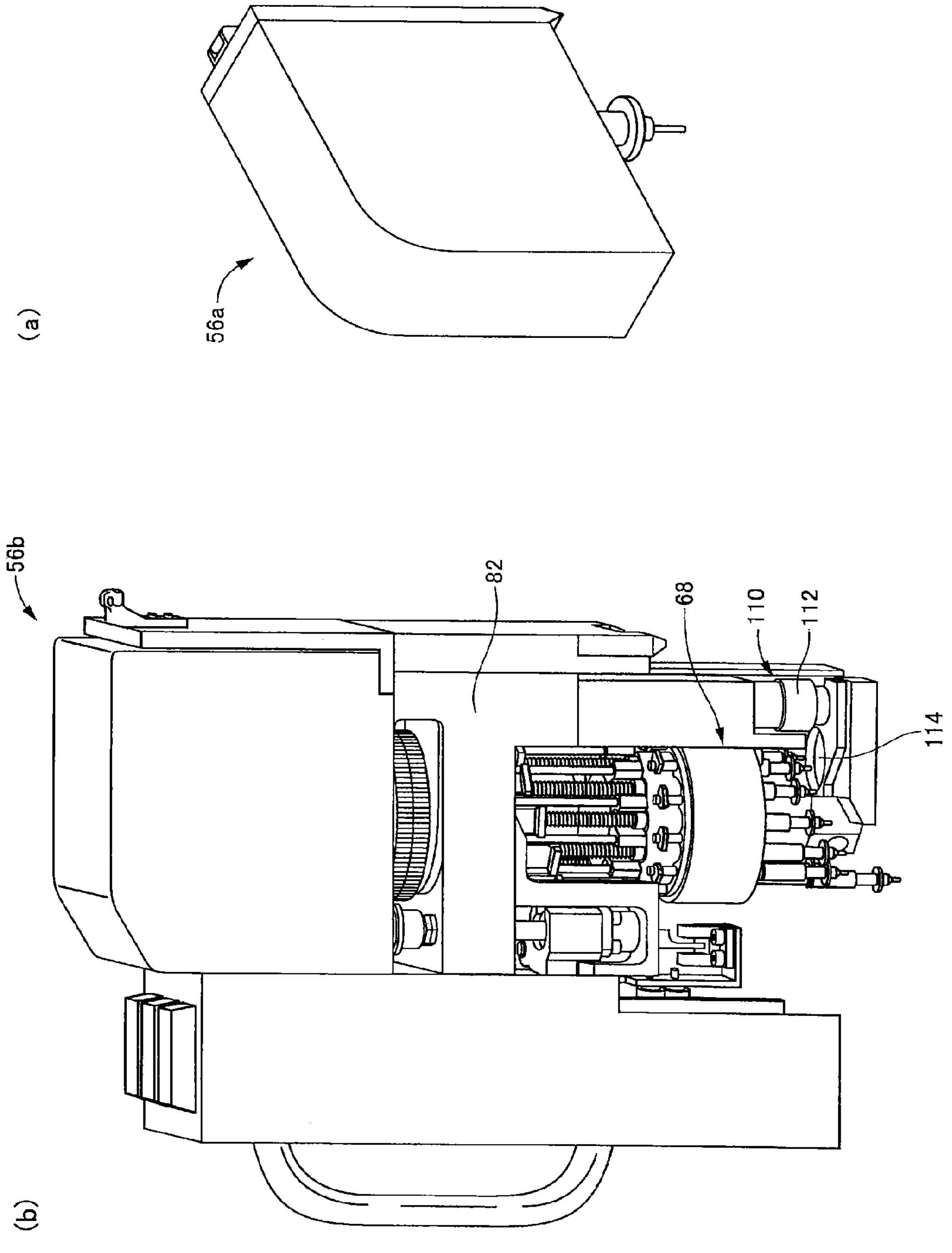

[FIG. 5]
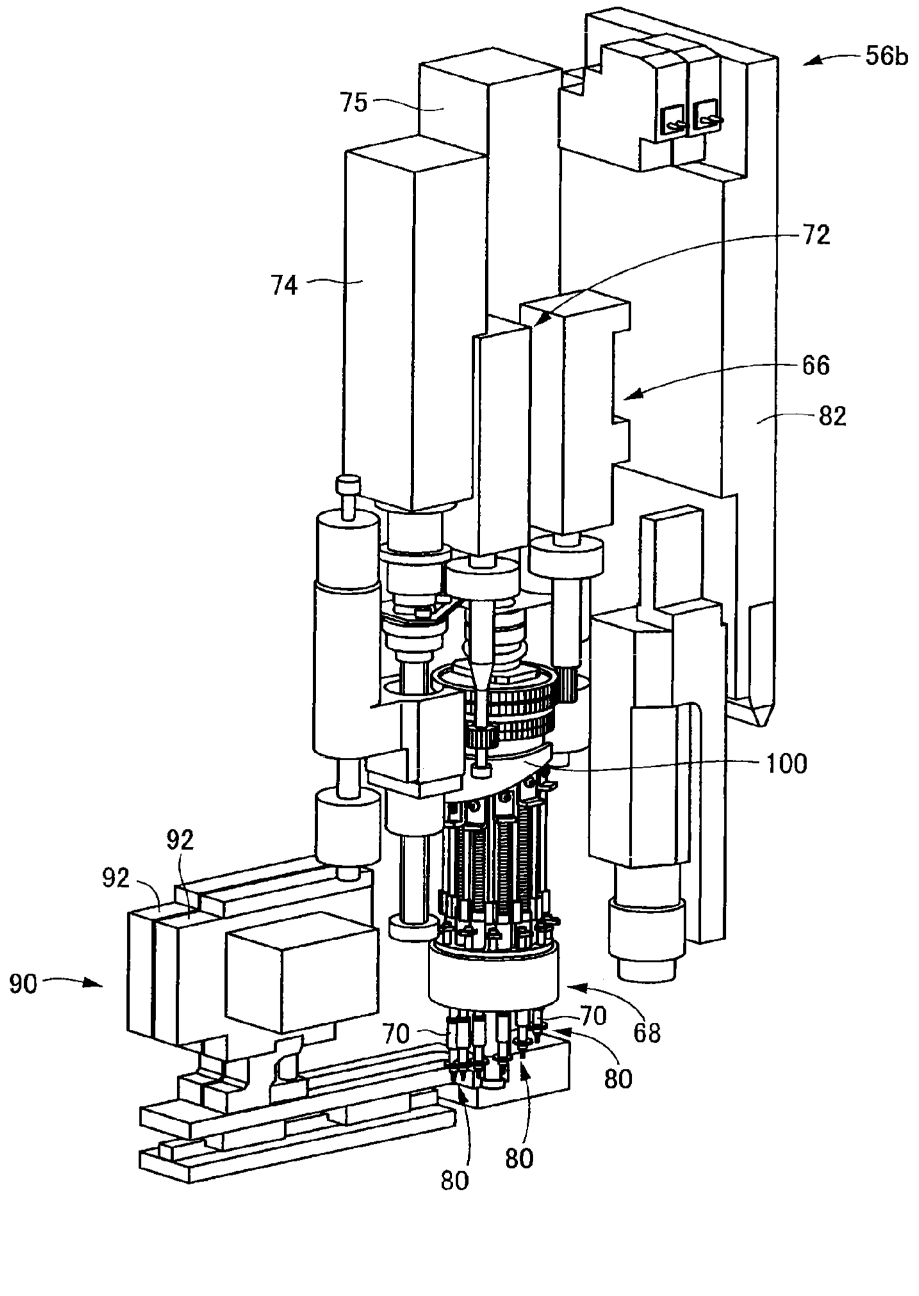

[FIG. 6]
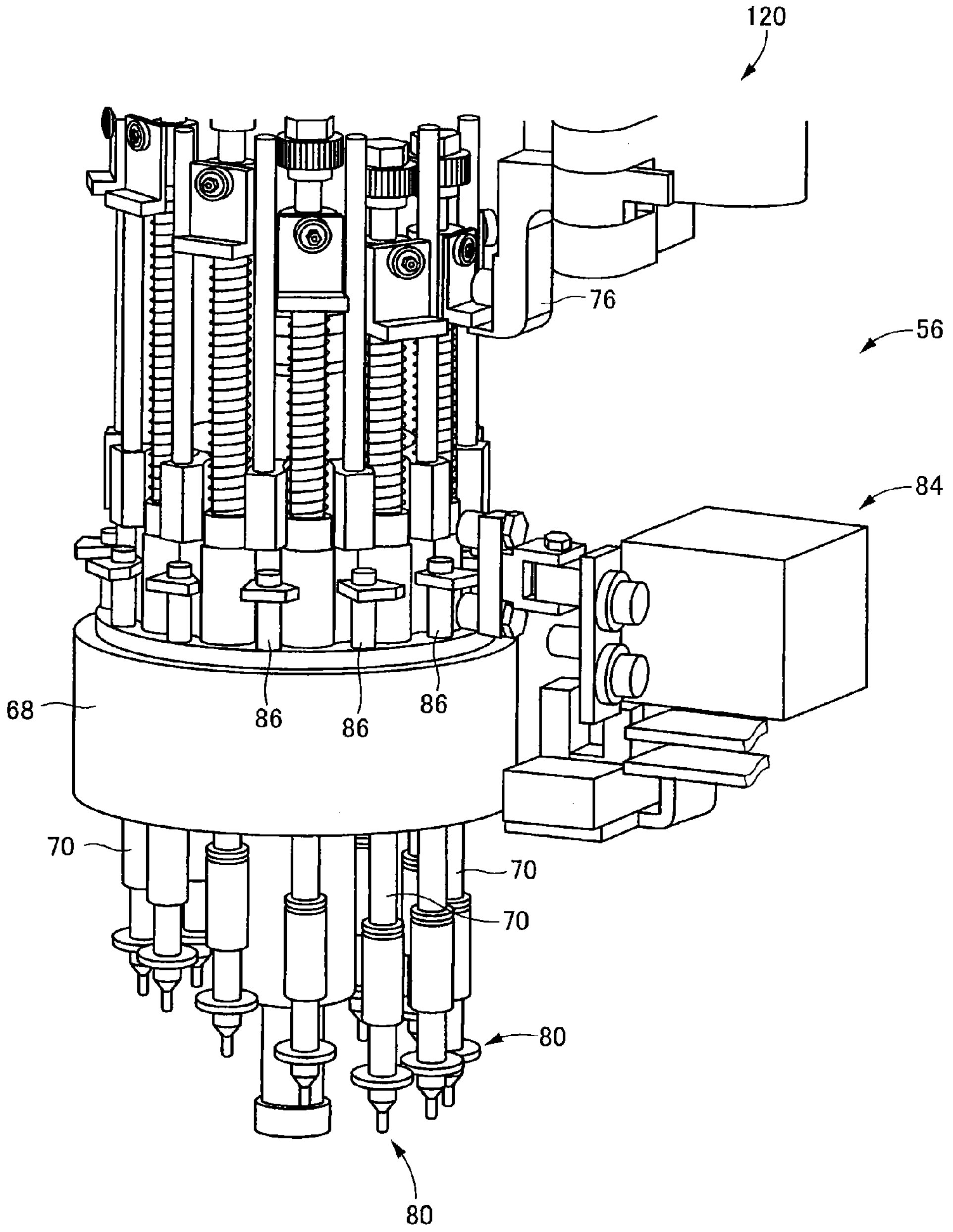

[FIG. 7]
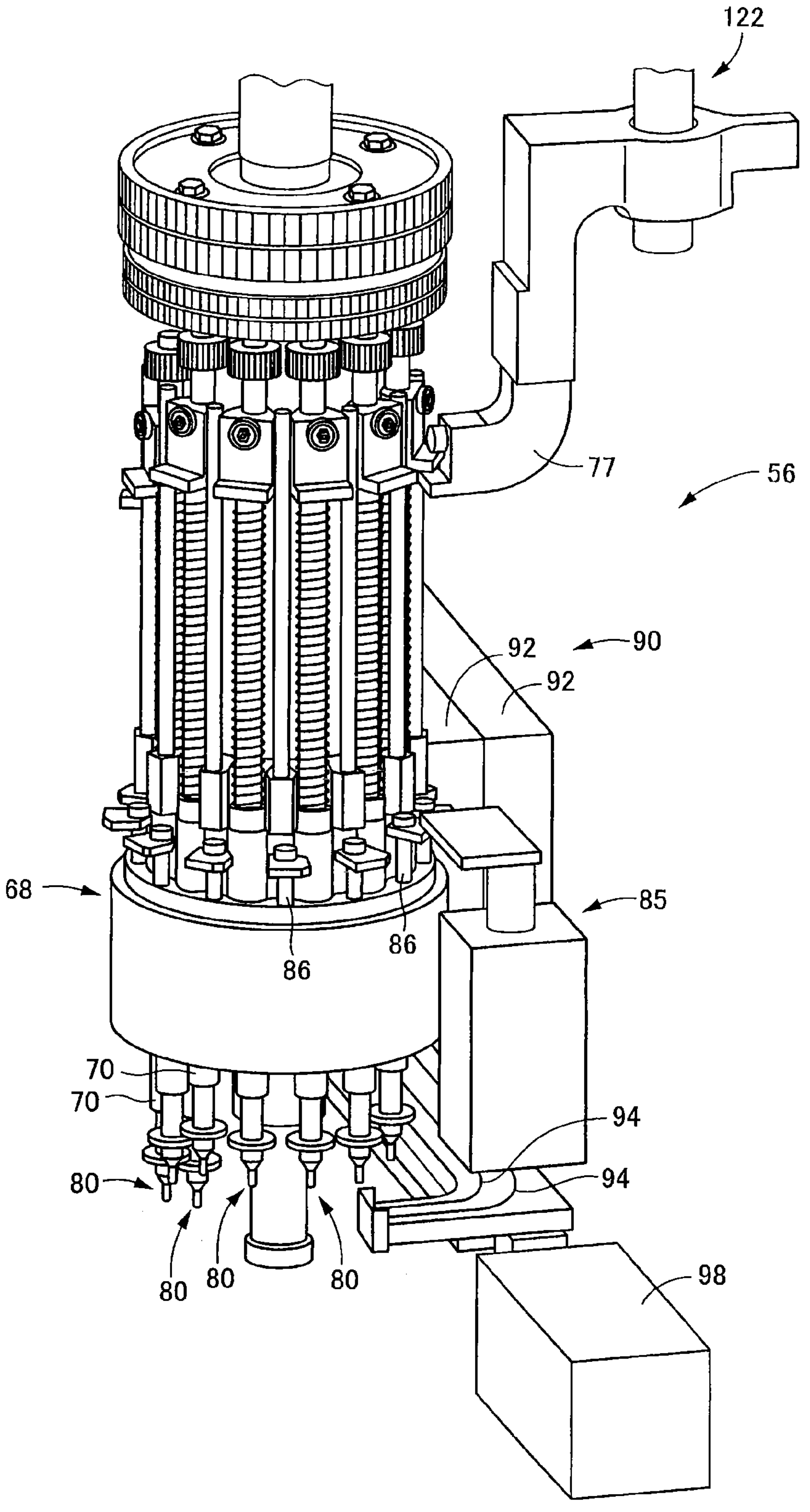

[FIG. 8]
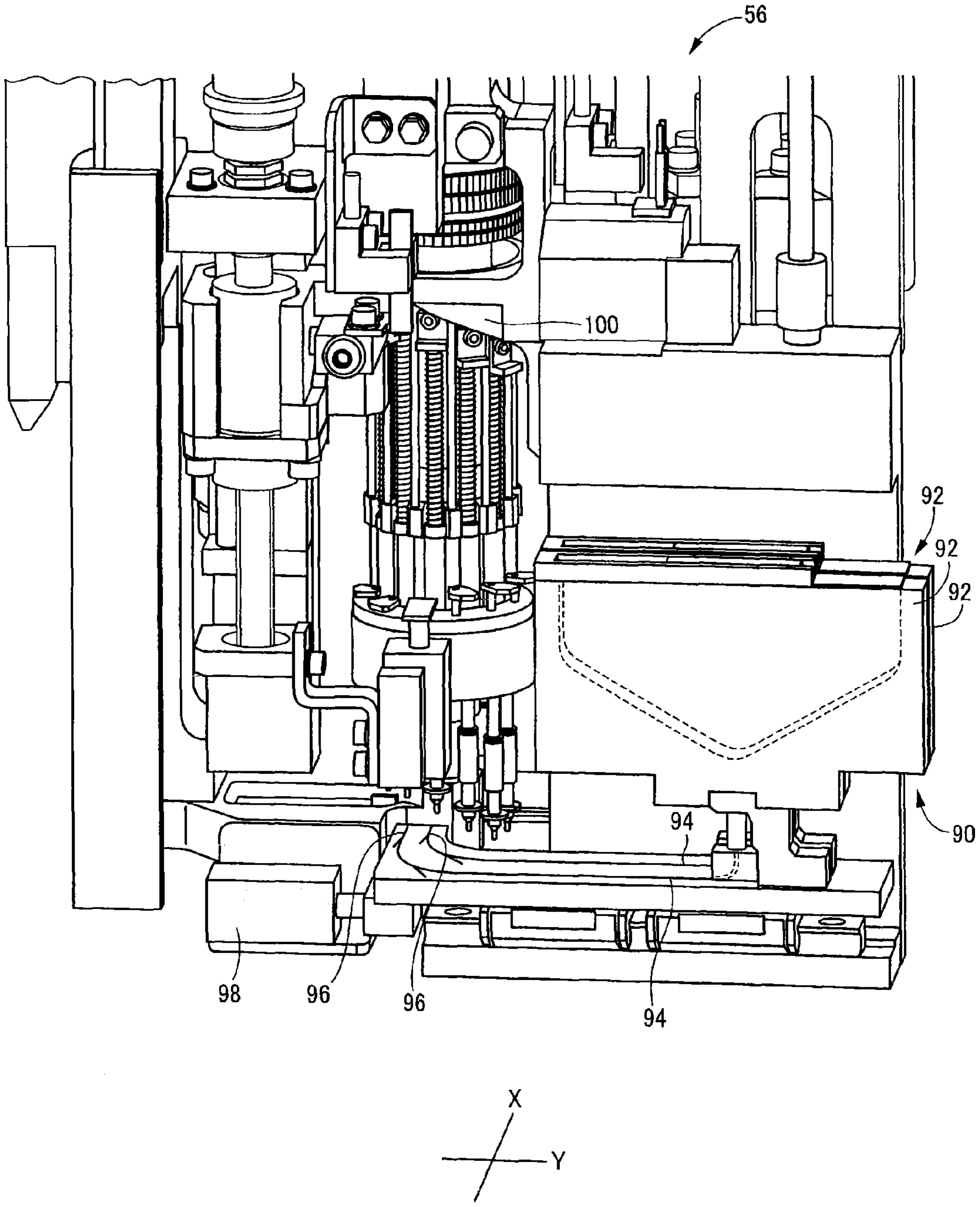

[FIG. 9]
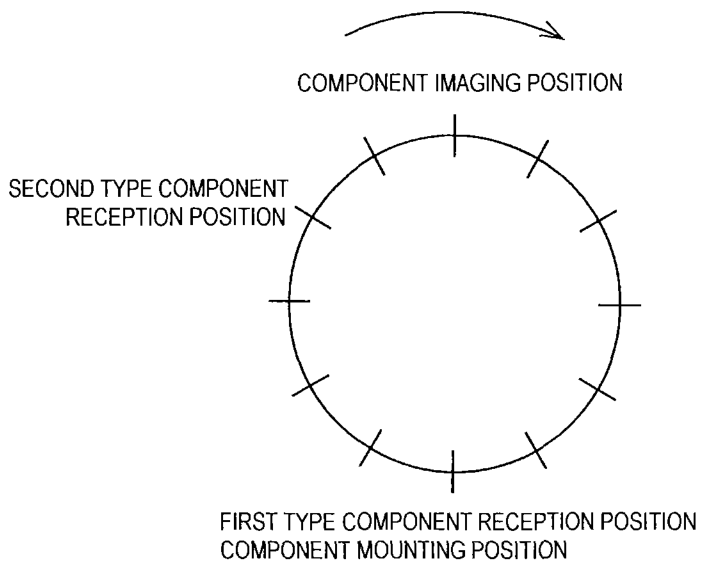

[FIG. 10]
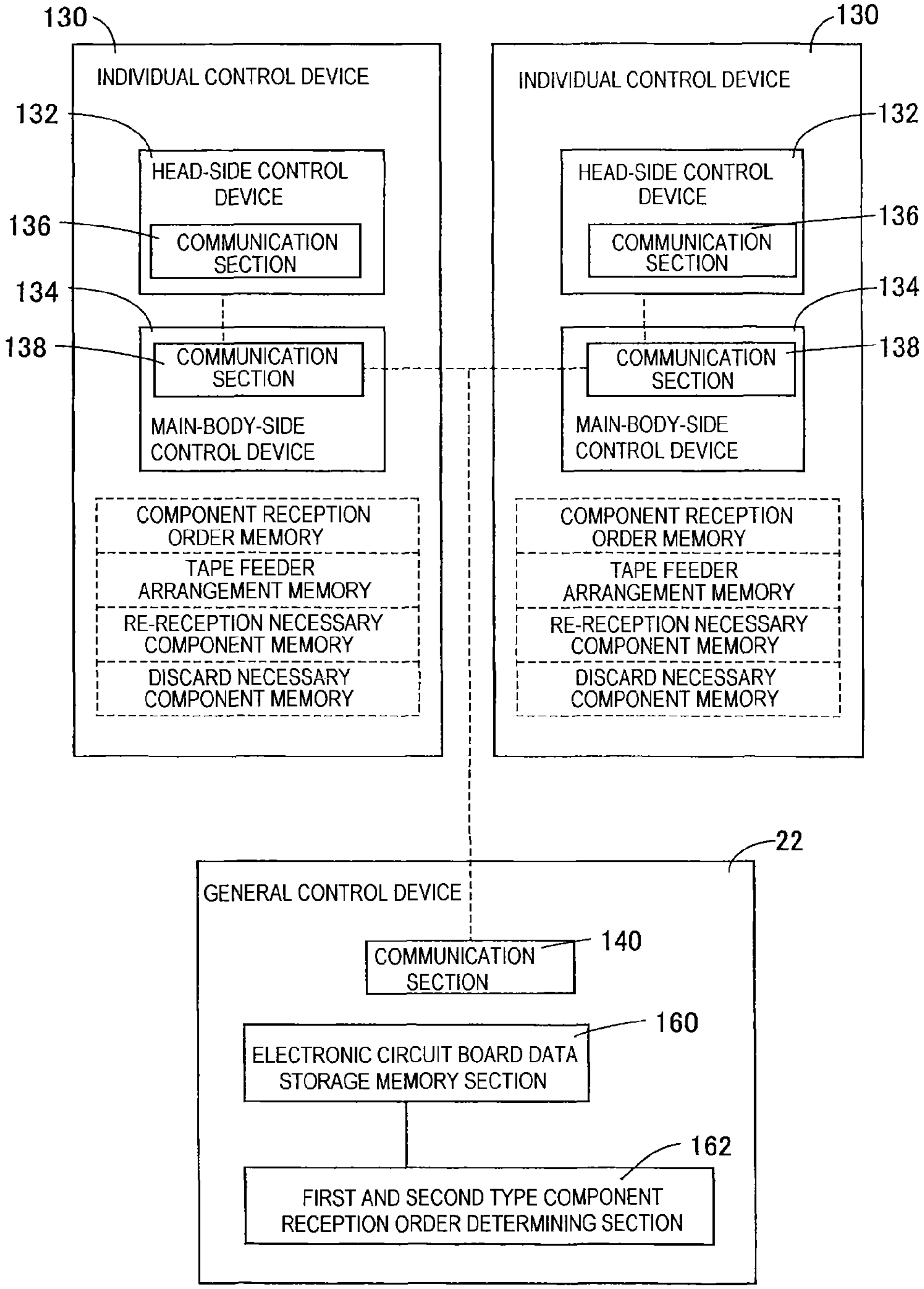

[FIG. 11]
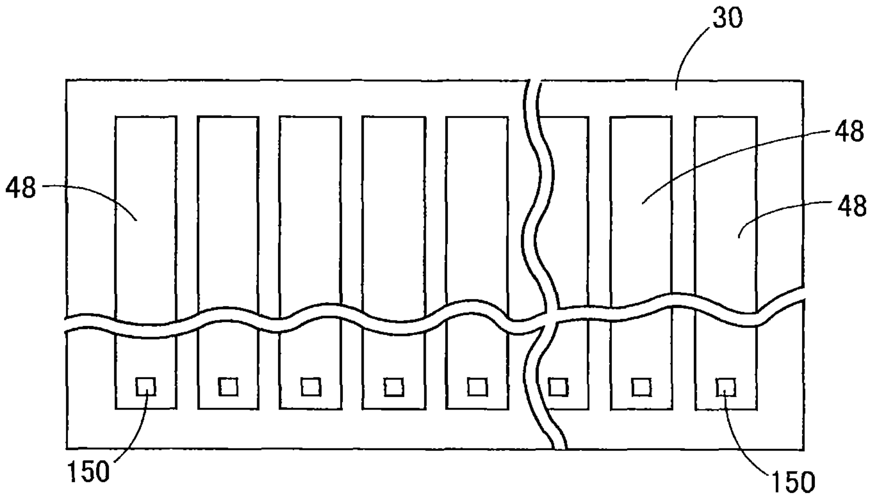
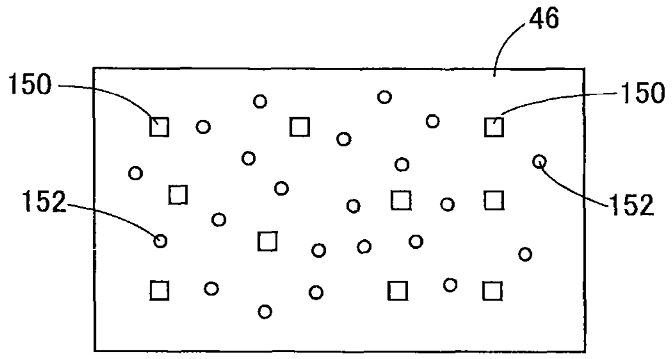

[FIG. 12]
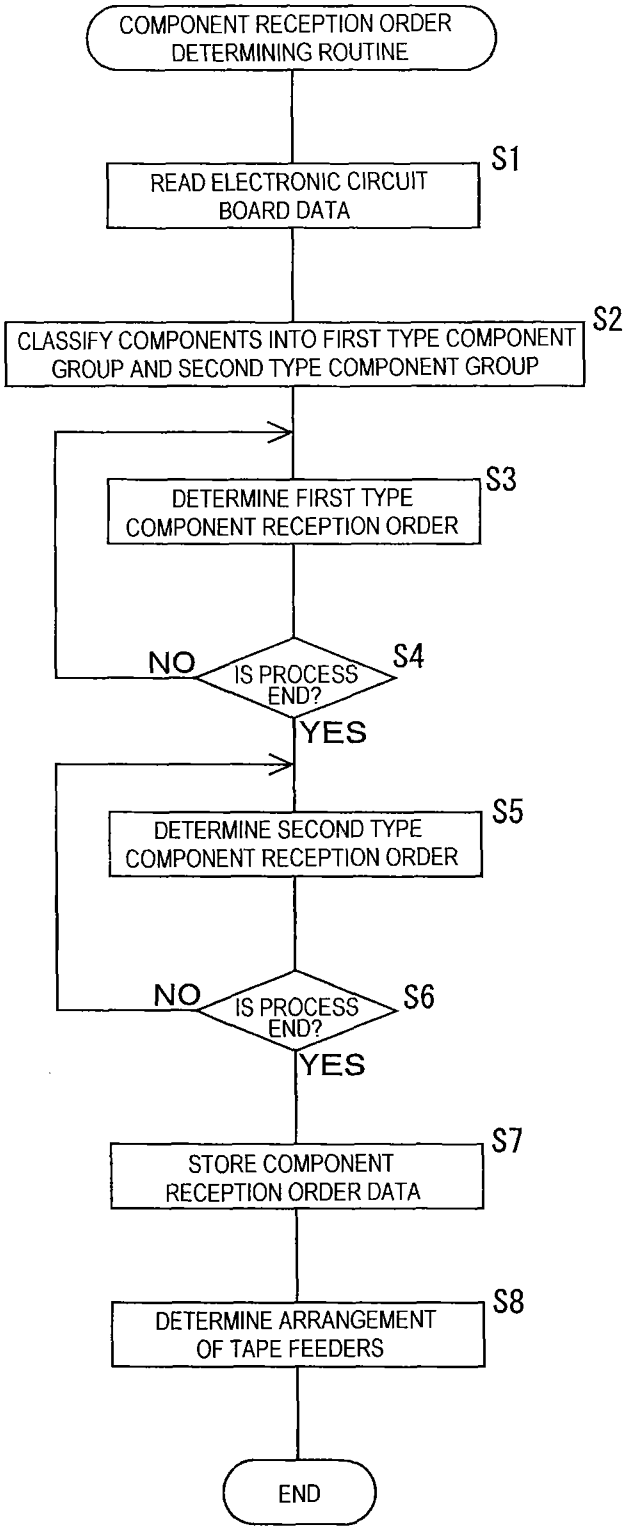

[FIG. 13]
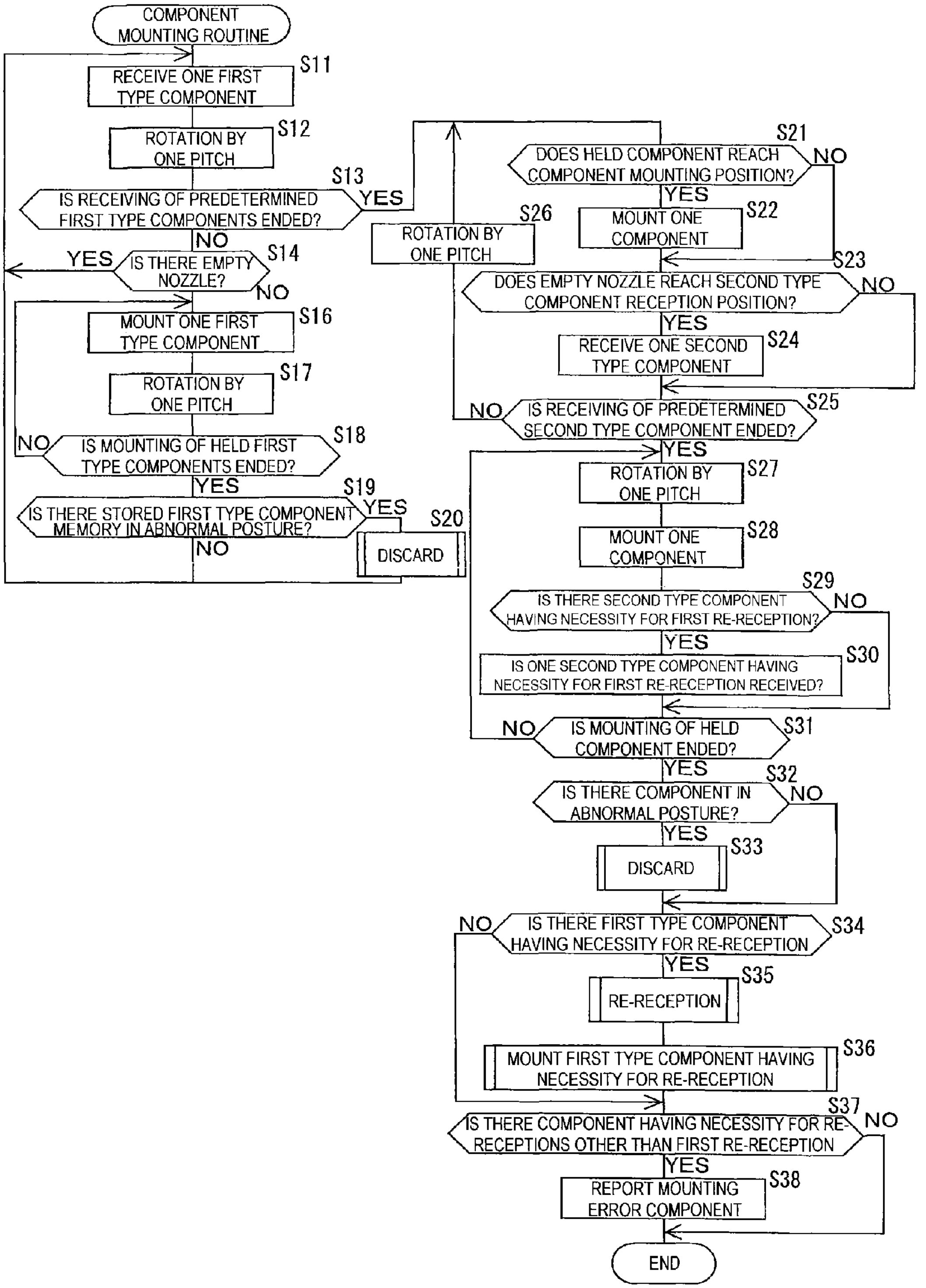

[FIG. 14]
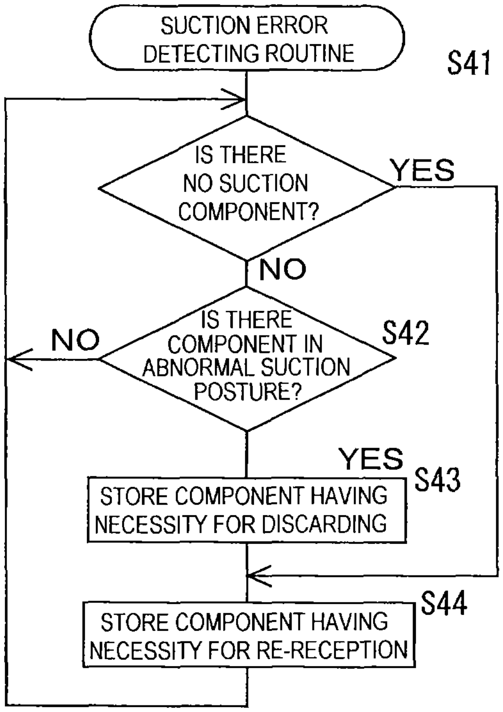

ELECTRONIC CIRCUIT COMPONENT MOUNTING METHOD AND MOUNTING SYSTEM

TECHNICAL FIELD

The present disclosure relates to a method for mounting both a first type electronic circuit component and a second type electronic circuit component on one circuit substrate by an electronic circuit component mounting machine that includes one or more mounting-machine-main-body-side feeders which are held by a mounting machine main body and supply the first type electronic circuit components, and one or more head-side feeders which are held by a head main body moved to a circuit-substrate conveying and holding device and the mounting-machine-main-body-side feeders by a head moving device together with amounting device which mounts electronic circuit components using a plurality of component holding tools and supply the second type electronic circuit components, and an electronic circuit component mounting system for implementing this method.

BACKGROUND ART

PTL 1 describes an electronic circuit component mounting machine that includes a plurality of mounting-machine-main-body-side feeders 26, and a plurality of bulk feeders 18 as head-side feeders, and an electronic circuit component mounting method using the same.

In PTL 2, in an electronic circuit component mounting machine which takes electronic circuit components out of a plurality of tape feeders 4a as mounting-machine-main-body-side feeders using a plurality of mounting heads 16 including a plurality of suction nozzles 16a, and mounts the taken electronic circuit components on printed circuit boards W, an operation for conveying from a waiting position of the printed circuit board W to a mounting operation performing position and a mounting preparation operation performed by the mounting heads 16 are simultaneously performed.

According to the electronic circuit component mounting machine and the electronic circuit component mounting method described in PTL 1, in order to take the electronic circuit components out of the plurality of bulk feeders 18, since it is not necessary to move a mounting device to the mounting-machine-main-body-side feeders, it is possible to efficiently perform a mounting operation. In the electronic circuit component mounting machine described in Citation Document 2, since a loading operation of the printed circuit board W and the mounting preparation operation performed by the mounting heads 16 are simultaneously performed, it is possible to efficiently perform a mounting operation.

CITATION LIST

Patent Literature

PTL 1: JP-A-2002-280793
PTL 2: JP-A-2008-198778

BRIEF SUMMARY

Technical Problem

The present disclosure has been made in view of the foregoing circumstances, and it is an object of the present disclosure to further improve the electronic circuit component mounting machines and electronic circuit component mounting methods described in Citation Documents 1 and 2.

Solution to Problem

In order to solve the above problem, there is provided an electronic circuit component mounting method for mounting both a first type electronic circuit component and a second type electronic circuit component on one circuit substrate held by a circuit-substrate conveying and holding device using an electronic circuit component mounting machine that includes (a) a mounting machine main body, (b) the circuit-substrate conveying and holding device which is held by the mounting machine main body, conveys the circuit substrate, and fixes and holds the circuit substrate, (c) one or more mounting-machine-main-body-side feeders which are held by the mounting machine main body, and supply the first type electronic circuit components, (d) a head main body which is moved with respect to the mounting machine main body by a head moving device to any position on a movement plane covering the circuit-substrate conveying and holding device and the mounting-machine-main-body-side feeders, (e) one or more head-side feeders that are held by the head main body, and supply the second type electronic circuit components, and (f) a mounting device which is held by the head main body, includes a plurality of component holding tools, receives the first type electronic circuit component from the mounting-machine-main-body-side feeder and the second type electronic circuit component from the head-side feeder and mounts the received components on the circuit substrate held by the circuit-substrate conveying and holding device using the plurality of component holding tools, the method including a first and second type component reception order determining process that determines an order of receiving the first type electronic circuit components and the second type electronic circuit components using the plurality of component holding tools, in which the first and second type component reception order determining process includes a head-main-body movement number minimizing process that determines an order of receiving the first type electronic circuit components and the second type electronic circuit components, so as to reduce the number of times the head main body moves between the circuit-substrate conveying and holding device and the mounting-machine-main-body-side feeders by the head moving device.

Further, the object is solved by an electronic circuit component mounting system including (A) an electronic circuit component mounting machine that includes (a) amounting machine main body, (b) a circuit-substrate conveying and holding device which is held by the mounting machine main body, conveys a circuit substrate, and fixes and holds the circuit substrate, (c) one or more mounting-machine-main-body-side feeders which are held by the mounting machine main body, and supply first type electronic circuit components, (d) a head main body which is moved with respect to the mounting machine main body by a head moving device to any position on a movement plane covering the circuit-substrate conveying and holding device and the mounting-machine-main-body-side feeders, (e) one or more head-side feeders that are held by the head main body, and supply second type electronic circuit components, (f) amounting device which is held by the head main body, includes a plurality of component holding tools, receives the first type electronic circuit component from the mounting-machine-main-body-side feeder and the second type electronic circuit component from the head-side feeder using the plurality of component holding tools, and mounts the received components on the circuit substrate held by the circuit-substrate conveying and holding device, and (g) a control device which controls the circuit-substrate conveying and holding device, the mounting-machine-main-body-side feeder, the head moving device, the head-side feeder, and the mounting device, and (B) a component reception order determining device that determines an order of receiving the first type electronic circuit components and the second type electronic circuit components using the plurality of component holding tools when it is necessary to mount both the first type electronic circuit component and the second type electronic circuit component on one circuit substrate held by the circuit-substrate conveying and holding device.

Advantageous Effects

In an aspect of the present disclosure, since the first and second type component reception order determining process that determines the reception order by the plurality of component holding tools includes the head-main-body movement number minimizing process that determines an order of receiving the first type electronic circuit components and the second type electronic circuit components, so as to reduce the number of times the head main body moves between the circuit-substrate conveying and holding device and the mounting-machine-main-body-side feeders by the head moving device, an effect of improving efficiency in the mounting operation is obtained.

Among the operations of the electronic circuit component mounting machine for mounting the first and second type electronic circuit components on the circuit substrate, an operation which particularly requires a time is the movement of the mounting device between the mounting-machine-main-body-side feeders and the circuit-substrate conveying and holding device. Accordingly, when this movement number is minimized, it is possible to minimize a time required for the mounting operation, and it is possible to improve operation efficiency.

In an aspect of the present disclosure, when it is necessary to mount both the first type electronic circuit component and the second type electronic circuit component on one circuit substrate held by the circuit-substrate conveying and holding device, since the electronic circuit component mounting system includes the component reception order determining device that determines the order of receiving the first type electronic circuit components and the second type electronic circuit components using the plurality of component holding tools, an effect of easily improving efficiency in the mounting operation is obtained.

When it is necessary to mount both the first type electronic circuit component and the second type electronic circuit component on one circuit substrate, it is necessary to determine the reception order using the plurality of component holding tools so as to improve efficiency in the mounting operation while taking into account characteristics of the mounting-machine-main-body-side feeders and the head-side feeders. However, when a determining rule is stored in the component reception order determining device, since the reception order is automatically determined, it is possible to easily improve efficiency in the mounting operation.

Hereinafter, some aspects of the present disclosure will be described. These aspects are non-limiting examples of the present disclosure.

(1) There is provided an electronic circuit component mounting method for mounting both a first type electronic circuit component and a second type electronic circuit component on one circuit substrate held by a circuit-substrate conveying and holding device using an electronic circuit component mounting machine that includes (a) a mounting machine main body, (b) the circuit-substrate conveying and holding device which is held by the mounting machine main body, conveys the circuit substrate, and fixes and holds the circuit substrate, (c) one or more mounting-machine-main-body-side feeders which are held by the mounting machine main body, and supply the first type electronic circuit components, (d) a head main body which is moved with respect to the mounting machine main body by a head moving device to any position on a movement plane covering the circuit-substrate conveying and holding device and the mounting-machine-main-body-side feeders, (e) one or more head-side feeders that are held by the head main body, and supply the second type electronic circuit components, and (f) a mounting device which is held by the head main body, includes a plurality of component holding tools, receives the first type electronic circuit component from the mounting-machine-main-body-side feeder and the second type electronic circuit component from the head-side feeder, and mounts the received components on the circuit substrate held by the circuit-substrate conveying and holding device using the plurality of component holding tools.

(2) In the electronic circuit component mounting method described in (1), as the electronic circuit component mounting machine, in the mounting device held by the head main body, a holding tool moving device that moves the plurality of component holding tools in a direction crossing an axis line of the component holding tools, and a holding tool advancing/retracting device that advances/retracts the component holding tools in a direction parallel to the axis line of the component holding tools may be used in addition to the plurality of component holding tools. The first type electronic circuit components from the mounting-machine-main-body-side feeders and the second type electronic circuit components from the head-side feeders may be selectively received by one component holding tool which is arbitrarily selected from the plurality of component holding tools, and the received component may be mounted on the circuit substrate held by the circuit-substrate conveying and holding device.

(3) The electronic circuit component mounting method described in (1) or (2) may include a first and second type component reception order determining process that determines an order of receiving the first type electronic circuit components and the second type electronic circuit components using the plurality of component holding tools.

(4) In the electronic circuit component mounting method described in (3), the first and second type component reception order determining process may be performed by a computer.

(5) In the electronic circuit component mounting method described in (3) or (4), the first and second type component reception order determining process may be performed based on information related to the type and the number of the first type electronic circuit components and the second type electronic circuit component to be mounted on the one circuit substrate.

(6) In the electronic circuit component mounting method described in (3) to (5), the first and second type component reception order determining process may be performed based on at least one of (a) information related to mounting positions of the first type electronic circuit components and the second type electronic circuit components on the one circuit substrate, and (b) information related to the arrangement of the plurality of mounting-machine-main-body-side feeders on the mounting machine main body.

(7) In the electronic circuit component mounting method described in any one of (3) to (6), the first and second type component reception order determining process may include a head-main-body movement number minimizing process that determines an order of receiving the first type electronic circuit components and the second type electronic circuit components, so as to reduce the number of times the head main body moves between the circuit-substrate conveying and holding device and the mounting-machine-main-body-side feeders by the head moving device.

(8) In the electronic circuit component mounting method described in any one of (3) to (7), the first and second type component reception order determining process may include a first and second type component batch reception order determining process that determines an order of receiving the first and second type electronic circuit components such that the receiving of the first type electronic circuit components and the receiving of the second type electronic circuit components are respectively performed together as a batch.

(9) In the electronic circuit component mounting method described in (8), the first and second type component batch reception order determining process may include a first type component reception previous-execution determining process that determines an order of receiving the first and second type electronic circuit components such that the receiving of the first type electronic circuit components is performed earlier than the receiving of the second type electronic circuit components.

(10) The electronic circuit component mounting method described in any one of (1) to (9) may further include a during-loading-substrate first type component receiving process that performs at least a part of the receiving of the first type electronic circuit components simultaneously with the loading of the circuit substrate by the circuit-substrate conveying and holding device.

(11) The electronic circuit component mounting method described in any one of (1) to (10) may further include a mounting and receiving simultaneous-execution process that starts to receive the second type electronic circuit components before the mounting of the first type electronic circuit components held by the plurality of component holding tools is ended.

(12) The electronic circuit component mounting method described in any one of (1) to (11) may further include a specific first type component receiving process which, when at least one of a component outage at the mounting-machine-main-body-side feeder and a component reception error from the mounting-machine-main-body-side feeder occurs, performs reception of a specific first type component which is a first type electronic circuit component for which a component outage or a component reception error has occurred, at any time after the receiving of the second type electronic circuit components has been completed.

In order to receive the specific first type components, it is necessary to move the head main body between the circuit-substrate conveying and holding device and the mounting-machine-main-body-side feeders, but the movement number is preferably as small as possible. Normally, the number of specific first type components is small, and the mounting device including the plurality of component holding tools moves once. Particularly, when the number of component holding tools is large, in many cases, a plurality of empty component holding tools that does not hold components may remain even though the receiving of the second type components is ended, and when the receiving of the second type components is ended, it may be possible to immediately move to receive the specific first type components. In this case, the receiving and mounting of the second type components can be simultaneously performed, whereas it is difficult to mount the second type components when the head main body moves toward the mounting-machine-main-body-side feeders. Even when the head main body starts to move toward the mounting-machine-main-body-side feeders after the receiving of the second type components is ended and after the mounting of the second type components is ended, there is no difference in operation efficiency thereof. Meanwhile, when the mounting of the second type components is ended, since all the component holding tools of the mounting device are in an empty state, even if the number of specific first type components is large, or even if the number of component holding tools of the mounting device is relatively small, the head main body normally moves to the mounting-machine-main-body-side feeders for receiving the specific first type components once. Accordingly, the head main body for receiving the specific first type components preferably stars to move after the mounting of the second type components is ended.

(13) The electronic circuit component mounting method described in any one of (1) to (12) may further include a discard necessary first type component receiving process which, when it is necessary to discard any of the first type electronic circuit components held by the plurality of component holding tools, performs discarding of the first type electronic circuit component while the head main body is moving to receive the next first type electronic circuit component.

(14) The electronic circuit component mounting method described in any one of (1) to (13) may further include a discard necessary second type component receiving process which, when it is necessary to discard any of the second type electronic circuit components held by the plurality of component holding tools, performs immediately starting to move the head main body to a component discarding position of the head main body by the head moving device and receiving the second type electronic circuit component by one of the plurality of component holding tools simultaneously with the movement.

(21) There is provided an electronic circuit component mounting system including an electronic circuit component mounting machine that includes (a) a mounting machine main body, (b) a circuit-substrate conveying and holding device which is held by the mounting machine main body, conveys a circuit substrate, and fixes and holds the circuit substrate, (c) one or more mounting-machine-main-body-side feeders which are held by the mounting machine main body, and supply first type electronic circuit components, (d) a head main body which is moved with respect to the mounting machine main body by a head moving device to any position on a movement plane covering the circuit-substrate conveying and holding device and the mounting-machine-main-body-side feeders, (e) one or more head-side feeders that are held by the head main body, and supply second type electronic circuit components, (f) amounting device which is held by the head main body, includes a plurality of component holding tools, receives the first type electronic circuit component from the mounting-machine-main-body-side feeder and the second type electronic circuit component from the head-side feeder using the plurality of component holding tools, and mounts the received components on the circuit substrate held by the circuit-substrate conveying and holding device, and (g) a control device which controls the circuit-substrate conveying and holding device, the mounting-machine-main-body-side feeder, the head moving device, the head-side feeder, and the mounting device, and a component reception order determining device that determines an order of receiving the first type electronic circuit components and the second type electronic circuit components using the plurality of component holding tools when it is necessary to mount both the first type electronic circuit component and the second type electronic circuit component on one circuit substrate held by the circuit-substrate conveying and holding device.

(22) In the electronic circuit component mounting system described in (21), the mounting device may further include a holding tool and head-side feeder relative moving device that relatively moves the plurality of component holding tools and the head-side feeders in a direction crossing an axis line of the component holding tools, and a holding tool advancing/retracting device that advances/retracts the plurality of component holding tools in a direction parallel to the axis line of the component holding tools. The first type electronic circuit components and the second type electronic circuit components are selectively received by one holding tool that is arbitrarily selected from the plurality of component holding tools, and the received components may be mounted on the circuit substrate held by the circuit-substrate conveying and holding device.

(23) In the electronic circuit component mounting system described in (22), the mounting device may further include a rotation holding body that is held by the head main body so as to rotate around a rotational axis line, and holds the plurality of component holding tools in a plurality of holding positions on the same circumference with the rotational axis line as its center, and a holding tool revolving device that revolves the plurality of component holding tools around the rotational axis line by rotating the rotation holding body around the rotation axis line, and selectively moves any one of the component holding tools to a component reception position facing component supply sections of the head-side feeders and component supply sections of the mounting-machine-main-body-side feeders. The rotation holding body and the holding tool revolving device may constitute the holding tool and head-side feeder relative moving device.

(24) In the electronic circuit component mounting system described in any one of (21) to (23), the component reception order determining device may include a head-main-body movement number minimizing section that determines an order of receiving the first type electronic circuit components and the second type electronic circuit components, so as to reduce the number of times the head main body moves between the circuit-substrate conveying and holding device and the mounting-machine-main-body-side feeders by the head moving device.

(25) In the electronic circuit component mounting system described in any one of (21) to (24), the component reception order determining device may include a first and second type component batch reception order determining section that determines an order of receiving the first and second type electronic circuit components such that the receiving of the first type electronic circuit components and the receiving of the second type electronic circuit components are respectively performed together as a batch.

(26) In the electronic circuit component mounting system described in (25), the first and second type component batch reception order determining section may include a first type component reception previous-execution determining section that determines an order of receiving the first and second type electronic circuit components such that the receiving of the first type electronic circuit components is performed earlier than the receiving of the second type electronic circuit components.

(27) In the electronic circuit component mounting system described in any one of (21) to (26), the control device may include a during-loading-substrate first type component reception control section that performs at least a part of the receiving of the first type electronic circuit components simultaneously with the loading of the circuit substrate by the circuit-substrate conveying and holding device.

(28) In the electronic circuit component mounting system described in any one of (21) to (27), the control device may include a mounting and receiving simultaneous-execution control section that starts to receive the second type electronic circuit components before the mounting of the first type electronic circuit components held by the plurality of component holding tools is ended.

(29) In the electronic circuit component mounting system described in any one of (21) to (28), the control device may include a specific first type component reception control section that, when at least one of a component outage at the mounting-machine-main-body-side feeder and a component reception error from the mounting-machine-main-body-side feeder occurs, performs reception of a specific first type component which is a first type electronic circuit component for which a component outage or a component reception error has occurred, at any time after the receiving of the second type electronic circuit components has been completed.

(30) In the electronic circuit component mounting system described in any one of (21) to (29), the control device includes a first type component discard necessary control section that, when it is necessary to discard any of the first type electronic circuit components held by the plurality of component holding tools, performs discarding of the first type electronic component while the head main body is moving to receive the next first type electronic circuit component.

(31) In the electronic circuit component mounting system described in any one of (21) to (30), the control device includes a second type component discard necessary control section that, when it is necessary to discard any of the second type electronic circuit components held by the plurality of component holding tools, performs immediately starting to move the head moving device a component discarding position of the head main body, and receiving the second type electronic circuit component by one of the plurality of component holding tools simultaneously with the movement.

(32) In the electronic circuit component mounting system described in any one of (21) to (31), the head-side feeder may include bulk feeders that accommodate the electronic circuit components in a bulk state in component accommodation sections, and are arranged in a line to supply the components from the component supply sections.

BRIEF DESCRIPTION OF DRAWINGS

FIG. 1 is a perspective view showing an electronic circuit component mounting system according to an embodiment of the present disclosure.

FIG. 2 is a perspective view showing a state where a ceiling panel of one cover is removed from two mounting modules which are parts of the electronic circuit component mounting system.

FIG. 3 is a perspective view showing a head moving device and a mounting head of a mounting device of the mounting module.

FIG. 4 is a perspective view showing the mounting head, in which FIG. 4(*a*) is a diagram showing a mounting head including one nozzle holder, and FIG. 4(*b*) is a diagram showing a mounting head including 12 nozzle holders.

FIG. 5 is a perspective view showing a state where a cover is removed from the mounting head including the 12 nozzle holders.

FIG. 6 is a perspective view showing a valve switching device, a lifting/lowering device, suction nozzles, and nozzle holders of the mounting head including the 12 nozzle holders.

FIG. 7 is a perspective view showing another valve switching device, another lifting/lowering device, the suction nozzles, and the nozzles holders of the mounting head including the 12 nozzle holders.

FIG. 8 is a perspective view showing the mounting head including the 12 nozzle holders when viewed from the side on which a bulk feeder is provided.

FIG. 9 is a schematic diagram for describing stop positions of the suction nozzles by the rotation of a rotation holding body in the mounting head including the 12 nozzle holders.

FIG. 10 is a schematic block diagram showing a control device of the electronic circuit component mounting system shown in FIG. 1.

FIG. 11 is a schematic plan view showing the relative positional relationship between a tape feeder and an electronic circuit to be assembled in one mounting module.

FIG. 12 is a flowchart showing a component reception order determining routine performed in a general control device of the electronic circuit component mounting system shown in FIG. 1.

FIG. 13 is a flowchart showing major parts of a component mounting routine performed in each of the mounting modules.

FIG. 14 is a flowchart showing apart of the component mounting routine.

DETAILED DESCRIPTION

Hereinafter, an embodiment of the present disclosure will be described with reference to the drawings. The structures of an electronic circuit component mounting system and a mounting module are the same as those described in detail in the specification of, for example, Japanese Patent Application No. 2011-206452, and thus, the description thereof will be briefly presented.

As shown in FIG. 1, a plurality of mounting modules 10 which are an example of the electronic circuit component mounting machine are arranged in a line to form a component mounting line 12. Each mounting module 10 includes an operation device 14, a display device (display) 16, and an individual control device, and the individual control device is generally controlled by a general control device 22. The general control device 22 includes an operation device 24 and a display device (display) 26. The component mounting line 12 and the general control device 22 constitute the electronic circuit component mounting system.

One constituent unit of the component mounting line 12 is illustrated in FIG. 2, but one constituent unit is configured such that two mounting modules 10 are supported by a common support table 28. The mounting modules 10 approach each other in a width direction, and are supported by the support table 28 so as to be moved in a forward and backward direction. An operator can access the inside of the respective mounting modules 10 by dragging the mounting modules forward one by one. Each mounting module 10 includes two front and rear printed-circuit-board conveyors 32 and 34 supported by a main body frame 30. Printed-circuit-board support devices that can be individually lifted with respect to the respective printed-circuit-board conveyors 32 and 34 are provided, and constitute printed-circuit-board holding devices 42 and 44 that hold circuit boards 46 so as to fix the circuit boards in cooperation with parts of the respective printed-circuit-board conveyors 32 and 34.

Each mounting module 10 includes a plurality of tape feeders 48 that is detachably held by the main body frame 30 and respectively supplies different type of electronic circuit components (hereinafter, referred to as components) one by one, and a mounting device 54 that takes the components out of these tape feeders 48 one by one and mounts the taken components on a circuit boards 46 held by the respective printed-circuit-board holding devices 42 and 44. As enlargedly illustrated in FIG. 3, the mounting device 54 includes a mounting head 56, and a head moving device 58 that moves the mounting head in an X-axis direction (rightward and leftward direction) and a Y-axis direction (forward and backward direction). Mounting heads 56*a* and 56*b* illustrated in FIG. 4 are prepared as the mounting head 56, and these mounting heads are selectively attached to an adapter 60 shown in FIG. 3 by an attachment and detachment device.

Among the plurality of different types of mounting heads 56*a* and 56*b*, the configuration of the mounting head 56*b* shown in FIG. 4(*b*) is representatively illustrated in FIG. 5. The mounting head 56*b* includes a rotation holding body 68 rotated with a regular angle by a holding body rotating motor 66, and a plurality of mounting units 70 is held by the rotation holding body 68 with the regular angle so as to move in an axial direction and individually rotate. Accordingly, each mounting unit 70 revolves around a rotational axis line of the rotation holding body 68 by the rotation of the rotation holding body 68, and can rotate around its own axis line. The absolute phase of the mounting unit 70 is controlled through relevant control of the rotation of a unit rotating motor 72 and the rotation of the holding body rotating motor 66. In a state where the plurality of mounting units 70 is present in a specific revolving position, the mounting units are lifted/lowered in an axial direction by lifting/lowering drive members 76 and 77 (see FIGS. 6 and 7) that are respectively lifted/lowered by two unit lifting/lowering motors 74 and 75. Suction nozzles 80 are detachably held by the respective lower ends of the plurality of mounting units 70, and the respective suction nozzles 80 are lifted/lowered by the lifting/lowering of the respective mounting units 70. The components are held through sucking and are taken out of the tape feeders 48 as the mounting-machine-main-body-side feeders and bulk feeders 90 (see FIGS. 7 and 8) as the head-side feeders, to be described below. The taken components are mounted on the circuit boards 46 held by the printed-circuit-board holding devices 42 and 44. The rotation holding body 68 or the respective motors 66, 72, 74 and 75 are held by a head main body 82 shown in FIG. 5, and are detachably attached to the adapter 60 (see FIG. 3) of the head main body 82 all at once.

The mounting module 10 being may be considered as divided into the mounting head 56 and a mounting machine main body to which the mounting head is detachably attached. The mounting machine main body includes the main body frame 30 of the mounting module 10, the printed-circuit-board conveyors 32 and 34 supported by the main body frame 30, the printed-circuit-board holding devices 42 and 44, the tape feeders 48, and the head moving device 58. An electrical control device of the mounting module 10 is provided in the support table 28, and thus, a part that accommodates the electrical control device of the support table 28 may be naturally considered as being present in the mounting machine main body.

The holding and releasing of the components by the suction nozzles 80 are performed through control of a negative pressure supply device and a positive pressure supply device (not illustrated) provided at the mounting machine main body and control of pressure switching units 84 and 85, which are shown in FIGS. 6 and 7 and are provided at the mounting head 56. By moving valve spools 86 in the axial direction by the pressure switching units 84 and 85, the negative pressure and the positive pressure are selectively supplied to the suction nozzles 80, and the suction nozzles 80 are opened to the atmosphere. In so doing, the holding and releasing of the components are controlled.

The plurality of tape feeders 48 is configured to supply components supported by component holding tapes one by one, and the bulk feeders 90 are configured to supply components accommodated in component storage chambers 92 shown in FIG. 8 in a bulk state from component supply sections 96 at front ends of guide passages 94 arranged in a line. The component supply sections 96 of the plurality of bulk feeders 90 are arranged in the Y-axis direction, and the bulk feeders 90 are moved in the Y-axis direction by the feeder moving device 98. Thus, the component supply sections 96 selectively move to positions facing the mounting units 70 one by one.

As a result, since the mounting head 56 includes a bulk component reception position as a second type component reception position corresponding to the component supply section 96 of the bulk feeder 90 and a tape component reception position as a first type component reception position corresponding to a front end of the tape feeder 48, as shown in FIG. 9. However, the tape component reception position is a common component mounting position between the tape component and the bulk component. The mounting head **56*b* includes a component imaging position between the bulk component reception position and the tape component reception position (component mounting position). As shown in FIG. 8, the distances between the mounting head 56*b* and the printed-circuit-board holding devices 42 and 44 are changed by the revolving of the suction nozzles 80 due to a cam 100. However, as shown in FIG. 4**(*b*), a component imaging device 110 is provided in a maximum distance position where the suction nozzles 80 are farthest from the printed-circuit-board holding devices 42 and 44. The component imaging device 110 includes a light guide device 114 and a CCD camera 112 which is an imaging device. In the present embodiment, a minimum distance stop position is set as the component mounting position where the electronic circuit components are mounted on the circuit boards, and a maximum distance stop position closest to the component mounting position, which is positioned on a downstream side from the component mounting position in the rotational direction (direction indicated by arrow in FIG. 9) of the rotation holding body 68 at the time of mounting, is set as the bulk component reception position, and downstream from that a stop position separated from the component mounting position by 180 degrees is used as the component imaging position.

As shown in FIGS. 6 and 7, lifting/lowering devices 120 and 122 are respectively provided in positions of the head main body 82 corresponding to the component mounting position (first type component reception position) and the second type component reception position. The lifting/lowering devices lift/lower the mounting units 70 and advance/retract the mounting units 70 with respect to the rotation body holding body 68 in the axial direction. As shown in FIG. 6, the lifting/lowering device 120 includes a lifting/lowering drive member 76 lifted/lowered by the unit lifting/lowering motor 74. In the component mounting position, the mounting units 70 are lowered toward the circuit boards 46 held by the printed-circuit-board holding devices 42 and 44 or toward the component supply sections of the tape feeders 48. As shown in FIG. 7, the lifting/lowering device 122 includes a lifting/lowering drive member 77 lifted/lowered by the unit lifting/lowering motor 75, and lowers the mounting units 70 toward the component supply sections 96 of the bulk feeders 90. The pressure switching units 84 and 85 are provided so as to correspond to these lifting/lowering devices 120 and 122. The negative pressure and the positive pressure are selectively supplied to the suction nozzles 80, and the suction nozzles 80 are opened to the atmosphere, synchronously with the lifting/lowering of the mounting units 70. In so doing, the holding and releasing of the components are controlled.

The operations of the holding body rotating motor 66, the unit rotating motor 72, the unit lifting/lowering motors 74 and 75 and the pressure switching units 84 and 85 are controlled by the individual control devices 130 of the respective mounting modules 10 shown in FIG. 10. The individual control device 130 includes a head-side control device 132, and a main-body-side control device 134, and the head-side control device 132 transmits and receives information or instruction by communicating with a communication section 138 of the main-body-side control device 134 through a communication section 136, and a power is supplied to the head-side control device 132 from the main-body-side control device 134 through a power supply line (not shown). The main-body-side control device 134 transmits and receives information or instruction to and from the general control device 22 via its own communication section 138 and communication section 140. In FIG. 10, only a part of the configuration of the main-body-side control device 134 which is required to describe the present disclosure is illustrated.

As described above, each mounting module 10 can mount the components supplied from any one of the tape feeders 48 and the bulk feeders 90 on the circuit boards 46. However, there may be different circumstances in taking the components out of the respective feeders 48 and 90. For this reason, in the present embodiment, when it is necessary to mount first type components 150 supplied from the tape feeders 48 indicated by square marks and second type components 152 supplied from the bulk feeders 90 indicated by circle marks on one circuit board 46 as shown in FIG. 11, a difference between the circumstances of both the feeders 48 and 90 is considered in order to improve efficiency in the mounting operation. Such a difference will be described below.

FIG. 12 is a flowchart showing a component reception order determining routine for determining an order of receiving the first type components (tape components) 150 and the second type components (bulk components) 152 by the plurality of suction nozzles 80 (mounting units 70) which sequentially revolves to the plurality of positions illustrated in FIG. 9 by the rotation of the rotation holding body in one mounting module 10. The component reception order determining routine may be performed in any mounting module 10, but is performed by the general control device 22 in the present embodiment. For this reason, as shown in FIG. 10, an electronic-circuit-board data memory section 160 and a component reception order determining section 162 are provided in the general control device 22. The electronic-circuit-board data memory section 160 is apart that stores electronic circuit board data including the types of the first type components 150 and the second type components 152 (hereinafter, referred to as components 150 and 152 unless it is necessary to particularly distinguish the components from each other) to be mounted by the component mounting line 12, coordinates of the mounting positions thereof, and mounting postures (rotation positions), and the component reception order determining section 162 is a part that performs the component reception order determining routine shown in FIG. 12 on each of the plurality of mounting modules 10. Based on the electronic circuit board data stored in the electronic-circuit-board data memory section 160, the components 150 and 152 to be mounted by the respective mounting modules 10 are determined, and the order of receiving the determined components 150 and 152 in the respective mounting modules 10 are determined.

For example, when the operator controls the operation device 24 while watching the display of the display device 26, the electronic circuit board data is stored in the electronic-circuit-board data memory section 160 from a host computer that manages information required in the operation of the entire factory including the mounting line 12 via the communication section 140. The components 150 and 152 to be mounted by the respective mounting modules 10 are basically determined such that the plurality of suction nozzles 80 held by the rotation holding body 68 of one mounting module 10 is all the same. In so doing, operation efficiency is improved.

In the component reception order determining routine, in step 1 (referred to as S1. The same is true of other steps.), the electronic circuit board data corresponding to the amount allocated to the respective mounting modules 10 are read from the electronic-circuit-board data memory section 160. Subsequently, after all the electronic circuit components included in the read electronic circuit board data are classified into the first type components 150 and the second type components 152 in S2, S3 and S4 are repeatedly performed, and the order of receiving the first type components 150 is determined. In this case, in the present embodiment, the order is determined such that the same first type components 150 supplied from the same tape feeder 48 are received as continuous as possible. In order to efficiently perform the mounting operation, the total movement distance of the mounting head 56*b* is preferably as short as possible, and in order to achieve this, the total distance of the movement distance for receiving the components and the movement distance for mounting the components is more preferably short. However, since a program is complicated, the order of receiving the first type components 150 is determined in many cases such that any one of the total movement distance for receiving the components and the total movement distance for mounting the components is short. In the present embodiment, the former is adopted.

After the order of receiving the first type components 150 is determined, S5 and S6 are repeatedly performed, and the order of receiving the second type components 152 is determined. Since the bulk feeders 90 that supply the second type components 152 move along with the mounting head 56*a*, the rotation of the rotation holding body 68 by one pitch (corresponding to an angle between the mounting unit and the adjacent mounting unit 70) and the movement of the bulk feeders 90 by the feeder moving device 98 are merely necessary at the time of receiving the components. Thus, times required to such rotation and movement are shorter than a time required for moving the mounting head 56*b* at the time of mounting the components in many cases. For this reason, in the present embodiment, the order of receiving the second type components 152 is determined such that the second type components to be mounted on the circuit board 46 in a position close to each other are sequentially received. For example, in consideration of the circumstance at the time of receiving the components, the order of receiving the second type components 152 may be determined such that the number of times the bulk feeders 90 move by the feeder moving device 98 is as small as possible.

Data related to the order of receiving the components 150 and 152 determined as stated above is stored in a component reception order memory in S7, and the arrangement of the tape feeders 48 on the main body frame 30 is determined in S8. This arrangement is determined such that the total movement distance of the mounting head 56*b* for receiving all the first type components 150 is as short as possible based on the electronic circuit board data read in S1 and the data related to the order of receiving the first type components 150 determined in S3 and S4, and is stored in a tape feeder arrangement memory. The data stored in the tape feeder arrangement memory is displayed on the display device 16 of each mounting module 10, and the operator arranges the tape feeders 48 according to this display.

Next, the mounting operations of the components 150 and 152 will be described by referring to the flowcharts shown in FIGS. 13 and 14. Firstly, S11 to S14 of a component mounting routine shown in FIG. 13 are repeatedly performed, and the first type components 150 are read from the component reception order memory one by one in the reception order while the rotation holding body 68 rotates by one pitch. The read first type component 150 is received by the suction nozzle 80. A suction error detecting routine shown in FIG. 14 is performed simultaneously with the receiving operation. That is, S41 and S42 are repeatedly performed, and it is determined whether or not there are the suction nozzles which are supposed to hold the components 150 and 152 and do not hold the components 150 and 152 or the suction nozzles which hold the components 150 and 152 and have abnormal holding postures, among the suction nozzles 80 reaching the component imaging position shown in FIG. 9. Since the latter determination is performed depending on whether or not the images of the components 150 and 152 captured by the component imaging device 110 are different from predetermined component images by more than a preset ratio, the determination is YES even when the sucked components 150 and 152 are different from the predetermined components as well as when the suction postures thereof are abnormal. When the determination of S41 is YES, the components 150 and 152 having the necessity for re-reception in S44 are stored in a re-reception necessary component memory. When the determination of S42 is YES, the components 150 and 152 to be discarded are stored in a discard necessary component memory in S43, and are then stored in the re-reception necessary component memory in S44.

During the execution of the component mounting routine, when the receiving of all the predetermined first type components is ended and the determination of S13 is YES, S21 and the subsequent steps are performed. However, when the receiving of all the first type components is not ended, the suction nozzle 80 reaching the first type component reception position is not an empty suction nozzle (is the suction nozzle that holds the component), and the determinations of S13 and S14 are NO, the mounting head 56*b* is moved above the printed-circuit-board holding devices 42 and 44, the subsequent S16 to S18 are repeatedly performed, and the first type components 150 held by the suction nozzles 80 are sequentially mounted one by one. In this case, as to the suction nozzles 80 reaching the component mounting position of FIG. 9, the mounting operation is not performed on the suction nozzle 80 from which an suction error such as no suction component or an abnormal suction posture is detected in the suction error detecting routine. The same is true of mounting operations in other steps. The mounting operations for the first type components 150 held by all the suction nozzles 80 of the mounting head 56*b* are ended. When the determination of S18 is YES, it is determined whether or not there are the first type components 150 determined as having the necessity for the discarding operation in S43 in S19. When there are such first type components, S20 is performed, and the discarding operation is performed on all the suction nozzles 80 determined as having the necessity for the discarding operation. The first type components 150 are discarded while the mounting head 56*b* is moving to receive the next first type components 150 after the mounting of all the held first type components 150 is ended. After the discarding operation is performed, or when the determination of S19 is NO, the execution of the component mounting routine returns to S11, and the receiving and mounting of the first type components 150 are continued.

When the determination of S13 is YES, S21 to S26 are repeatedly performed, and the mounting of the first type components 150 and the receiving of the second type components 152 are simultaneously performed. Firstly, in S21, it is determined whether or not the components (first type components 150 at this point of time) held by the suction nozzles 80 reach the component mounting position of FIG. 9. This determination is initially NO, and it is determined whether or not the empty nozzle reaches the second type component reception position in S23. When this determination is YES, one second type component 12 is held in S24. However, the determination of S23 is not YES until the empty suction nozzle positioned in the component mounting position (first type component reception position) reaches the second type component reception position, and it is determined whether or not the receiving of the predetermined second type component 152 is ended in S25. Since this determination is initially NO, the rotation holding body 68 is rotated by one pitch in S26, and S21 and the subsequent steps are performed again. During the repetition of the aforementioned executions, when the determination of S21 is YES, one component is mounted in S22. When the determination of S23 is YES, one second type component 152 is held in S24. Times are respectively necessary to mount the component in S22 and hold the second type component 152 in S24. However, since the YES determinations of S21 and S23 merely lead to the executions of S22 and S24, the executions of S22 and S24 are waited, and the next determination is not performed. Thus, after the determinations of both S21 and S23 are YES, the mounting operation in S22 and the holding operation in S24 are substantially simultaneously performed. The mounting of the first type component 150 and the holding of the second type component 152 are simultaneously performed for while the first type components 150 reach the component mounting position. However, when the second type components 152 reach the component mounting position, the receiving and mounting of the second type components 152 are simultaneously performed.

When the receiving of the predetermined second type components 152 is ended and the determination of S25 is YES, the execution of the component mounting routine proceeds to S27. One component 150 or 152 (the second type component 152 is used in many cases, but the first type component 150 is used in some cases when the number of second type components 152 to be mounted is small) is mounted by executing S27 and S28. In S29, it is determined whether or not there are the second type components 152 having the necessity for the first re-reception in S29. In S44 of the suction error detecting routine, it is determined whether or not there are the second type components 152 that are initially stored. The components 150 and 152 having the necessity for the second re-reception and the subsequent re-receptions are also stored in the re-reception necessary component memory. However, as will be described below, the second re-reception and the subsequent re-receptions are not performed, and the re-reception of the first type components 150 is separately performed. For this reason, it is necessary to initially determine whether or not there are the second type components having the necessity for re-reception. When the determination of S29 is YES, the re-reception of the second type components 152 is performed in S30.

Thereafter, in S31, it is determined whether or not the mounting of all the components 150 and 152 held by the mounting head 56*b* is ended. However, the initial determination is naturally NO, and S27 and the subsequent steps are repeatedly performed. The determination of S31 is YES, and the components are held by the suction nozzles 80 in an abnormal posture in S32. It is determined whether or not there are the components 150 and 152 stored as discard necessary components in S43 of the suction error detecting routine. When this determination is YES, all the discard necessary components are discarded in S33. The second type components 152 are discarded in many cases, but the first type components 150 are discarded in some cases. Thereafter, in S34, it is determined whether or not there are the first type components 150 stored as re-reception necessary components in S44 of the suction error detecting routine. When this determination is YES, in S35, 36, the re-reception and mounting of all the first type components having the necessity for re-reception are performed. As described above, the re-reception of the second type components 152 is performed simultaneously with the mounting of the components 150 and 152, whereas the re-reception of the first type components 150 is ultimately performed all at once in order to allow the number of times the mounting head 56*b* moves between the tape feeders 48 and the printed-circuit-board holding devices 42 and 44 to be as small as possible.

After the re-reception and mounting of the first type components 150 is performed, or when the determination of S34 is NO, S37 and S38 are performed. It is determined whether or not there are the components stored as components having the necessity for the second re-reception and the subsequent re-receptions in the re-reception necessary component memory, among the components 150 and 152. When there are such components, the fact that there are such components is displayed on the display device 16 of each mounting module 10. It is no accident that it is necessary to perform the re-reception of the same components 150 or 152 even though the re-reception of any of the components 150 and 152 is performed once. This means that some defects occur and there is a high possibility that it will be necessary for the operator to investigate causes. Thus, the fact that it is necessary to investigate the causes is displayed on the display device 16. This display may be displayed on the display device 16 of the mounting module 10 or may be displayed on the display device 26 of the general control device 22 while specifying any of the mounting modules 10.

Although the description has been omitted in the aforementioned description in order to avoid the complication, the revolving positions of the suction nozzles 80 and the components 150 and 152 held by the suction nozzles are changed by one pitch whenever the rotation holding body 68 is rotated by one pitch in S12, S17, S26 and S27. A part that stores a change in this revolving position is present in the individual control device 130 of each mounting module 10, and the determinations in the respective steps of the component mounting routine are performed based on the data stored in this part.

In the aforementioned embodiment, the components 150 and 152 are discarded in S32 and S33 after the mounting of the components 150 and 152 is performed. This is because it is necessary to move the mounting head 56*b* to the component discarding position in order to discard the components and to avoid the degradation of efficiency in the mounting operation by a time required for this movement. However, the suction nozzles 80 that hold the components 150 and 152 to be discarded are not used to hold other components. There is a concern that the components 150 and 152 held in the abnormal posture fall during the holding. In order to avoid these disadvantages, there is a possibility that the components will be discarded while the receiving and mounting of the components 150 and 152 are repeatedly performed. For example, when the number of suction nozzles that holds the components in the abnormal posture is equal to or greater than a preset number (plural number), or when the rotation holding body 68 rotates by more than a preset amount (preset rotational angle) after the suction nozzles 80 hold the components 150 and 152 in the abnormal posture, the discarding operation is performed.

It has been assumed in the aforementioned description that the suction nozzles 80 held by the rotation holding body 68 are all the same. In the present embodiment, the mounting line 12 includes the plurality of mounting modules 10, and the components 150 and 152 to be mounted by one mounting module 10 are basically determined such that the plurality of suction nozzles 80 held by the rotation holding body 68 of one mounting module 10 is all the same, as mentioned above. However, there are the mounting modules 10 to which this assumption is not applied in some cases. When the mounting operation is performed on one circuit board 46 by only one electronic circuit component mounting machine, the plurality of different types of suction nozzles 80 is attached in many cases. The present disclosure is applicable to such cases. In such cases, in the mounting head that holds the plurality of suction nozzles 80 as in the mounting head 56*b*, even though the first type components 150 to be received are still present and the empty suction nozzles 80 are still present, since the empty suction nozzles 80 moved to the first type component reception position are not appropriate for the first type components 150 to be received the next time, the receiving may not performed. In this case, while the empty suction nozzles 80 are maintained in an empty state, the reception order may be changed such that the components to be received the next time are received by other suction nozzles 80 or the other first type components 150 of which the reception order is later are received by the empty suction nozzles 80. Alternatively, the second type components 152 may be received by the empty suction nozzles 80. The mounting of the components that are already held may be started while the empty suction nozzles 80 are maintained in an empty state.

As in the aforementioned embodiment, when the mounting of the first type components 150 is previously performed, the loading of the circuit boards 46 to the mounting module 10 and the receiving of the first type components 150 necessary for a relatively long time is preferably simultaneously performed. This feature may be adopted separately from the feature that "the component reception order is determined so as to reduce the number of times the mounting head 56*b* moves between the printed-circuit-board holding devices 42 and 44 and the mounting-machine-main-body-side feeders such as the tape feeders 48".

However, when the mounting of the first type components 150 and the mounting of the second type components 152 are respectively performed together as a batch, the number of times the mounting head 56*b* moves between the printed-circuit-board holding devices 42 and 44 and the tape feeders 48 which are the main-body-side feeders is preferably small, and the mounting of the second type components 152 may be previously performed in this respect.

When the mounting of the second type components 152 is performed earlier than the mounting of the first type components 150, at the time of starting to mount the first type components 150, a part of the plurality of suction nozzles 80 of the rotation holding body 68 already holds the second type components 152 in some cases. In this case, the number of first type components 150 to be received is smaller than the total number of the suction nozzles 80 of the rotation holding body 68. For this reason, there is a possibility that the number of times the rotation holding body 68 moves to the tape feeders 48 will be increased. However, after the mounting of the second type components that are already held is ended, when the rotation holding body 68 is moved toward a group of tape feeders 48 to receive the first type components 150, such a situation may be avoided.

The reception order of the first type components 150 and the second type components 152 are not limited to the aforementioned embodiment, and the reception order of the first type components 150 and the second type components 152 may be determined so as to reduce the number of times the head main body 82 (mounting head 56*b*) moves between the printed-circuit-board holding devices 42 and 44 and the tape feeders 48 by the head moving device 58.

For example, when it is assumed that the number of suction nozzles 80 of the mounting head 56*b* is 12, the number of first type components 150 to be mounted is 25, and the number of second type components 152 to be mounted is 10, as in (1) a case where the receiving of 12 first type components→the mounting of 12 first type components→the receiving of 12 first type components→the mounting of 12 first type components→the receiving of one first type component→the mounting of one first type component→the receiving of 10 second type components→the mounting of 10 second type components are performed, and as in (2) a case where the receiving of 12 first type components→the mounting of 12 first type components→the receiving of one first type component→the mounting of one first type component→the receiving of 10 second type components→the mounting of 10 second type components→the receiving of 12 first type components→the mounting of 12 first type components are performed, the reception order of the first and second type components are different from each other, but the number of times the mounting head 56*b* moves to receive the first type components 150 is the same. As in (3) a case where the receiving of 8 first type components→the mounting of 8 first type components→the receiving of 8 first type components→the mounting of 8 first type components→the receiving of 9 first type components→the mounting of 9 first type components→the receiving of 10 second type components→the mounting of 10 second type components are performed, even when the number of times the first type components 150 are received is not the same as the number of suction nozzles 80, the number of times the mounting head 56*b* moves is the same. Alternatively, as in (4) a case where the receiving of 8 first type components→the mounting of 8 first type components→the receiving of 3 second type components→the mounting of 3 second type components→the receiving of 8 first type components→the mounting of 8 first type components are performed, the receiving of 3 second type components→the mounting of 3 second type components→the receiving of 9 first type components→the mounting of 9 first type components are performed, and the receiving of 4 second type components→the mounting of 4 second type components are performed, if the second type components 152 are received during the mounting of the first type components 150, even when the second type components 152 are not received all at once, the number of times the mounting head 56*b* moves is the same, and a large difference in the total time required for the mounting operation does not occur.

For example, in the case (4), if the receiving of the second type components is performed along with the receiving of the first type components of which the mounting position is close to the mounting position of the second type components, an effect of improving the efficiency of the mounting operation is obtained.

Although it has been described in the aforementioned embodiment that these component supply sections 96 are selectively moved to the common first type component reception position by moving the plurality of bulk feeders 90 by the feeder moving device 98, the plurality of bulk feeders may be fixed to the head main body such that each component supply section corresponds to each of the plurality of revolving positions of the suction nozzles 80, as described in, for example, Japanese Patent Application No. 2011-206452.

Although it has been described in the aforementioned embodiment that the mounting head including the plurality of suction nozzles 80 includes the rotation holding body 68, the present disclosure is applicable to an electronic circuit component mounting machine including a non-rotational mounting head that holds the plurality of suction nozzles along a straight line, and receives and mounts the components by the suction nozzles selected from these suction nozzles, and an electronic circuit component mounting system including the electronic circuit component mounting machine. Further, the present disclosure is applicable to an electronic circuit component mounting method using the mounting machine or the mounting system.

REFERENCE SIGNS LIST

10: Mounting module, 12: Component mounting line, 22: General control device, 42, 44: Printed-circuit-board holding device, 46: Circuit board, 48: Tape feeder (main-body-side feeder), 54: Mounting device, 56: Mounting head (56*a*, 56*b*), 68: Rotation holding body, 70: Mounting unit, 80: Suction nozzle, 90: Bulk feeder (head-side feeder), 110: Component imaging device, 130: Individual control device, 150: First type component, 152: Second type component, 160: Electronic-circuit-board data memory section, 162: Component reception order determining section

The invention claimed is:

1. An electronic circuit component mounting method for mounting both a first type electronic circuit component and a second type electronic circuit component on one circuit substrate held by a circuit-substrate conveying and holding device using an electronic circuit component mounting machine that includes (a) a mounting machine main body, (b) the circuit-substrate conveying and holding device which is held by the mounting machine main body, conveys the circuit substrate, and fixes and holds the circuit substrate, (c) one or more mounting-machine-main-body-side feeders which are held by the mounting machine main body, and supply the first type electronic circuit components, (d) a head main body which is moved with respect to the mounting machine main body by a head moving device to any position on a movement plane covering the circuit-substrate conveying and holding device and the mounting-machine-main-body-side feeders, (e) one or more head-side feeders that are held by the head main body, and supply the second type electronic circuit components, and (f) a mounting device which includes a rotation holding body that is rotatably held by the head main body and a plurality of component holding tools that are held by the rotation holding body, receives the first type electronic circuit component from the mounting-machine-main-body-side feeder and the second type electronic circuit component from the head-side feeder by rotating the rotation holding body with respect to the head main body and the head-side feeder to position the plurality of component holding tools such that individual component holding tools can receive the first and second type electronic circuit components and mounts the received first and second type components on the circuit substrate held by the circuit-substrate conveying and holding device using the plurality of component holding tools, the method comprising:

determining an order of receiving the first type electronic circuit components and the second type electronic circuit components using the plurality of component holding tools, so as to reduce the number of times the head main body moves between the circuit-substrate conveying and holding device and the mounting-machine-main-body-side feeders by the head moving device during mounting of the first and second components on the circuit substrate held by the circuit-substrate conveying and holding device using the plurality of component holding tools; and rotating the rotation holding body to change positions of the plurality of component holding tools so that the plurality of component holding tools receive the first type electronic circuit components from the mounting-machine-main-body-side feeder and the second type electronic components from the head-side feeder in the determined order of receiving.

2. The electronic circuit component mounting method according to claim 1, wherein the order of receiving the first type electronic circuit components and the second type electronic circuit components is determined such that the receiving of the first type electronic circuit components and the receiving of the second type electronic circuit components are each respectively performed as a batch.

3. The electronic circuit component mounting method according to claim 2, wherein determining the order of receiving the first and second electronic components includes a first type component reception previous-execution determining process that determines the order of receiving the first and second type electronic circuit components such that the receiving of the first type electronic circuit components is performed earlier than the receiving of the second type electronic circuit components.

4. The electronic circuit component mounting method according to claim 1, further comprising:

performing at least a part of the receiving of the first type electronic circuit components simultaneously with a loading of the circuit substrate by the circuit-substrate conveying and holding device.

5. The electronic circuit component mounting method according to claim 1, further comprising:

receiving the second type electronic circuit components before the mounting of the first type electronic circuit components held by the plurality of component holding tools is ended.

6. The electronic circuit component mounting method according to claim 1, further comprising:

performing reception of a specific first type component which is a first type electronic circuit component for which a component outage or a component reception error has occurred, at any time after the receiving of the second type electronic circuit components has been completed.

7. The electronic circuit component mounting method according to claim 1, further comprising:

moving the head main body to a discarding position, discarding the first type electronic circuit component, and moving the head main body to receive a next first type electronic circuit component.

8. The electronic circuit component mounting method according to claim 1, further comprising:

starting to move the head main body to a component discarding position of the head main body by the head moving device and simultaneously receiving the second type electronic circuit component by one of the plurality of component holding tools when discarding any of the second type electronic circuit components held by the plurality of component holding tools.

9. An electronic circuit component mounting system comprising:

an electronic circuit component mounting machine that includes (a) a mounting machine main body, (b) a circuit-substrate conveying and holding device which is held by the mounting machine main body, conveys a circuit substrate, and fixes and holds the circuit substrate, (c) one or more mounting-machine-main-body-side feeders which are held by the mounting machine main body, and supply first type electronic circuit components, (d) a head main body which is moved with respect to the mounting machine main body by a head moving device to any position on a movement plane covering the circuit-substrate conveying and holding device and the mounting-machine-main-body-side feeders, (e) one or more head-side feeders that are held by the head main body, and supply second type electronic circuit components, (f) a mounting device which includes a rotation holding body that is rotatably held by the head main body and a plurality of component holding tools that are held by the rotation holding body, receives the first type electronic circuit component from the mounting-machine-main-body-side feeder and the second type electronic circuit component from the head-side feeder by rotating the rotation holding body with respect to the head main body and the head-side feeder to position the plurality of component holding tools such that individual component holding tools can receive the first and second type electronic circuit components and mounts the received first and second type components on the circuit substrate held by the circuit-substrate conveying and holding device using the plurality of component holding tools, and (g) a control device which controls the circuit-substrate conveying and holding device, the mounting-machine-main-body-side feeder, the head moving device, the head-side feeder, and the mounting device; and circuitry configured to determine an order of receiving the first type electronic circuit components and the second type electronic circuit components using the plurality of component holding tools to mount both the first type electronic circuit components and the second type electronic circuit components on one circuit substrate held by the circuit-substrate conveying and holding device during mounting of the first and second components on the circuit substrate held by the circuit-substrate conveying and holding device using the plurality of component holding tools, and rotate the rotation holding body to change positions of the plurality of component holding tools so that the plurality of component holding tools receive the first type electronic circuit components from the mounting-machine-main-body-side feeder and the second type electronic components from the head-side feeder in the determined order of receiving.

* * * * *